United States Patent
Chuang

(10) Patent No.: US 8,293,567 B2
(45) Date of Patent: Oct. 23, 2012

(54) CIGS SOLAR CELL HAVING THERMAL EXPANSION BUFFER LAYER AND METHOD FOR FABRICATING THE SAME

(75) Inventor: Chuan-Lung Chuang, Taoyuan (TW)

(73) Assignee: Jenn Feng Industrial Co., Ltd., Ping Chang (TW)

( * ) Notice: Subject to any disclaimer, the term of this patent is extended or adjusted under 35 U.S.C. 154(b) by 141 days.

(21) Appl. No.: 13/013,938

(22) Filed: Jan. 26, 2011

(65) Prior Publication Data

US 2011/0117692 A1    May 19, 2011

Related U.S. Application Data

(62) Division of application No. 12/407,178, filed on Mar. 19, 2009, now abandoned.

(51) Int. Cl.
*H01L 31/18* (2006.01)

(52) U.S. Cl. .................................. 438/95; 257/E31.027

(58) Field of Classification Search .................. None
See application file for complete search history.

(56) References Cited

U.S. PATENT DOCUMENTS

2010/0218827 A1*    9/2010    Aono et al. .................... 136/264

* cited by examiner

*Primary Examiner* — Seahvosh Nikmanesh
(74) *Attorney, Agent, or Firm* — Rabin & Berdo, P.C.

(57) ABSTRACT

A copper/indium/gallium/selenium (CIGS) solar cell including a thermal expansion buffer layer, and a method for fabricating the same are provided. The thermal expansion buffer layer is configured between an alloy thin film layer and a CIGS thin film layer. The thermal expansion buffer layer is deposited by executing a thin film deposition process with a continuous sputtering machine bombarding a cuprous sulphide ($Cu_2S$) or cuprous selenide ($Cu_2Se$) target. Then, a CIGS thin film is further provided on the thermal expansion buffer layer. Finally, a thermal treatment is conducted for melting to integrate the copper ingredients of different thin film layers, thus improving the bondability between the thin film layers and preventing the cracking or the peeling off of the thin film layers caused by the thermal expansion difference.

10 Claims, 4 Drawing Sheets

CIGS SOLAR CELL HAVING THERMAL EXPANSION BUFFER LAYER AND METHOD FOR FABRICATING THE SAME

CROSS-REFERENCE TO RELATED APPLICATION

The present invention is a divisional application claiming the benefit of U.S. patent application Ser. No. 12/407,178 filed on Mar. 19, 2009.

BACKGROUND OF THE INVENTION

1. Field of the Invention

The present invention relates generally to a copper/indium/gallium/selenium (CIGS) solar cell and a method for fabricating the same, and more particularly, to a CIGS solar cell including a thermal expansion buffer layer configured between an alloy thin film layer and a CIGS thin film layer, and a method for fabricating the same.

2. The Prior Arts

CIGS thin film solar cells are being expected as one type of the most potentially low cost solar cells. Comparing with the other current thin film battery technologies, a CIGS thin film solar cell has higher efficiency. Currently, a small size CIGS thin film solar cell unit may achieve an efficiency of up to 19%, and a large size one may achieve an efficiency of up to 13%. Further, the CIGS thin film solar cell can be fabricated by a chemical vapor deposition (CVD) process which is adapted for low cost and large size processing. Furthermore, the CIGS thin film solar cell is radiation resistible and light weighted.

FIG. 1 is a schematic diagram illustrating a conventional CIGS thin film solar cell 1. Referring to FIG. 1, the CIGS thin film solar cell 1 includes a substrate 10, a molybdenum thin film layer 20, an alloy thin film layer 50 and a CIGS thin film layer 80. The molybdenum thin film layer 20 is deposited by sputtering on the substrate 10 for serving as a back electrode. The alloy thin film layer 50 is deposited by sputtering on the molybdenum thin film layer 20 for improving the electrical conductivity and reducing the resistance coefficient. The CIGS thin film layer 80 is then configured on the alloy thin film layer 50 by a synchronizing evaporation deposition or a selenylation process for serving as a light absorbing layer of the CIGS solar cell 1.

However, when such a CIGS solar cell 1 is exposed under the sunlight which causes the temperature raises, the difference of thermal expansion coefficient between the alloy thin film layer 50 and the CIGS thin film layer 80 may cause the films cracking or peeling off. This may impair the photoelectric transformation efficiency of the CIGS solar cell 1, or even destroy the CIGS solar cell.

As such a CIGS solar cell resistive to the stress caused by the thermal expansion difference is desired for solving the problem existed in the conventional technology.

SUMMARY OF THE INVENTION

A primary objective of the present invention is to provide CIGS solar cell. The CIGS solar cell includes a substrate, a molybdenum thin film layer, an alloy thin film layer, a thermal expansion buffer layer and a CIGS thin film layer. The alloy thin film layer is provided between the alloy thin film layer and the CIGS thin film layer. The thermal expansion buffer layer is made of cuprous sulphide ($Cu_2S$) or cuprous selenide ($Cu_2Se$).

A further objective of the present invention is to provide a method for fabricating a CIGS solar cell. The method includes configuring thermal expansion buffer layer onto an alloy thin film layer disposed on a substrate with a continuous sputtering machine, and then depositing a CIGS thin film layer onto the thermal expansion buffer layer.

A still further objective of the present invention is to provide a method for fabricating a CIGS solar cell. The method includes conducting a thermal treatment to a substrate together with a molybdenum thin film layer, an alloy thin film layer, a thermal expansion buffer layer, and a CIGS thin film layer disposed thereon, for melting to integrate the copper ingredients of the alloy thin film layer, the thermal expansion buffer layer, and the CIGS thin film layer, thus improving the bondability between the thin film layers.

Accordingly, the present invention is adapted for solving the problems of the conventional technologies as discussed above, thus preventing the cracking or the peeling off of the thin film layers caused by the thermal expansion difference.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
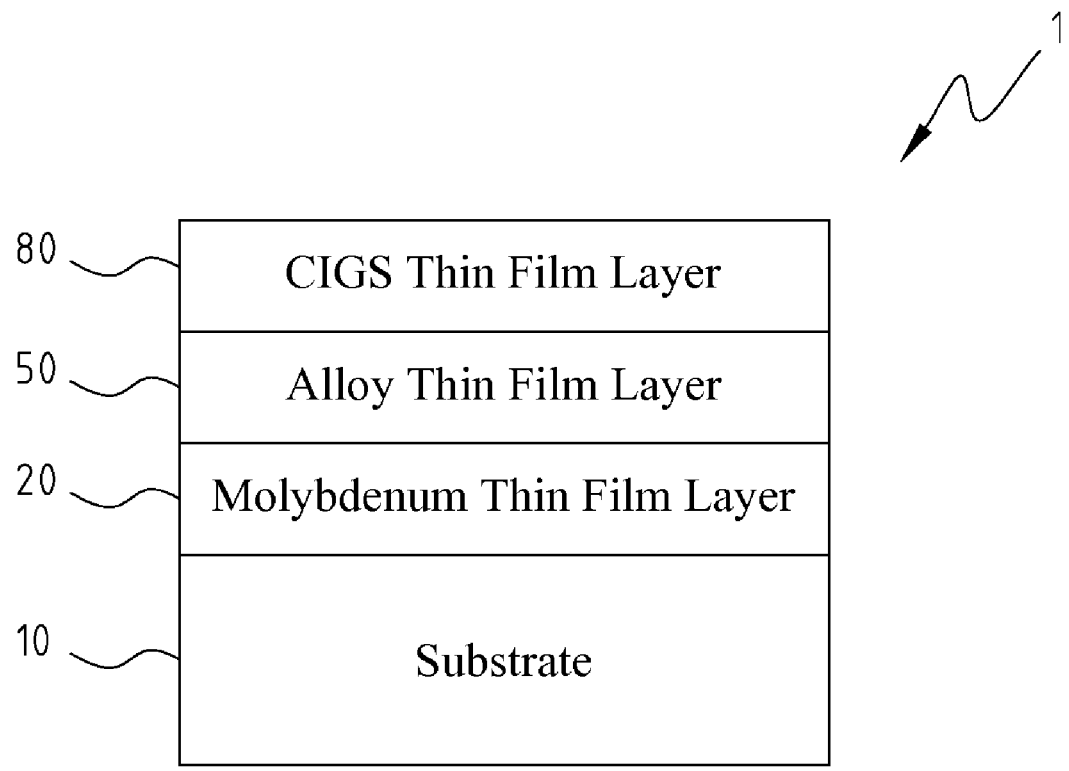
FIG. 1 is a schematic diagram illustrating a conventional CIGS thin film solar cell.
Figure 2:
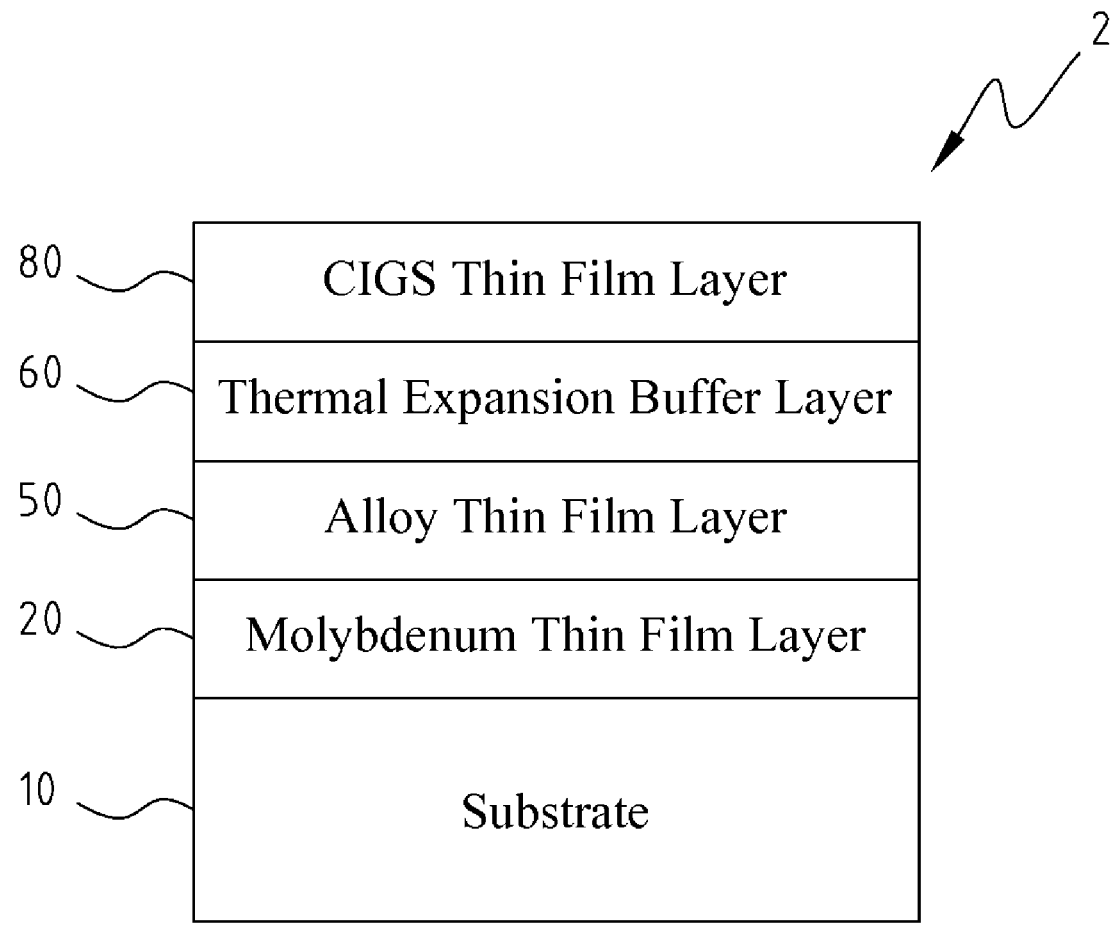
FIG. 2 is a structural diagram illustrating a CIGS solar cell structure according to an embodiment of the present invention.

FIG. 2 is a structural diagram illustrating a CIGS solar cell structure according to an embodiment of the present invention. Referring to FIG. 2, a CIGS solar cell 2 includes a substrate 10, a molybdenum thin film layer 20, an alloy thin film layer 50, a thermal expansion buffer layer 60, and a CIGS thin film layer 80. The substrate 10, the molybdenum thin film layer 20, the alloy thin film layer 50, the thermal expansion buffer layer 60, and the CIGS thin film layer 80 are sequentially bottom-up stacked one upon another.

The alloy thin film layer 50 is made of an alloy consisting of molybdenum, and copper, or aluminum, or silver. The alloy thin film layer 50 has a thermal expansion coefficient ranging from $5.0 \times 10^{-6}$ cm/° C. to $10.5 \times 10^{-6}$ cm/° C., and a thickness ranging from 0.1 μm to 0.25 μm.

The thermal expansion buffer thin film layer 60 is made of cuprous sulphide ($Cu_2S$) or cuprous selenide ($Cu_2Se$). The thermal expansion buffer thin film 60 has a thermal expansion ranging from $5.0 \times 10^{-6}$ cm/° C. to $10.5 \times 10^{-6}$ cm/° C., and a thickness ranging from 0.2 μm to 0.5 μm. The CIGS thin film layer 80 has a thermal expansion ranging from $5.0 \times 10^{-6}$ cm/° C. to $9.3 \times 10^{-6}$ cm/° C., and a thickness ranging from 0.2 μm to 0.5 μm.

Figure 3:
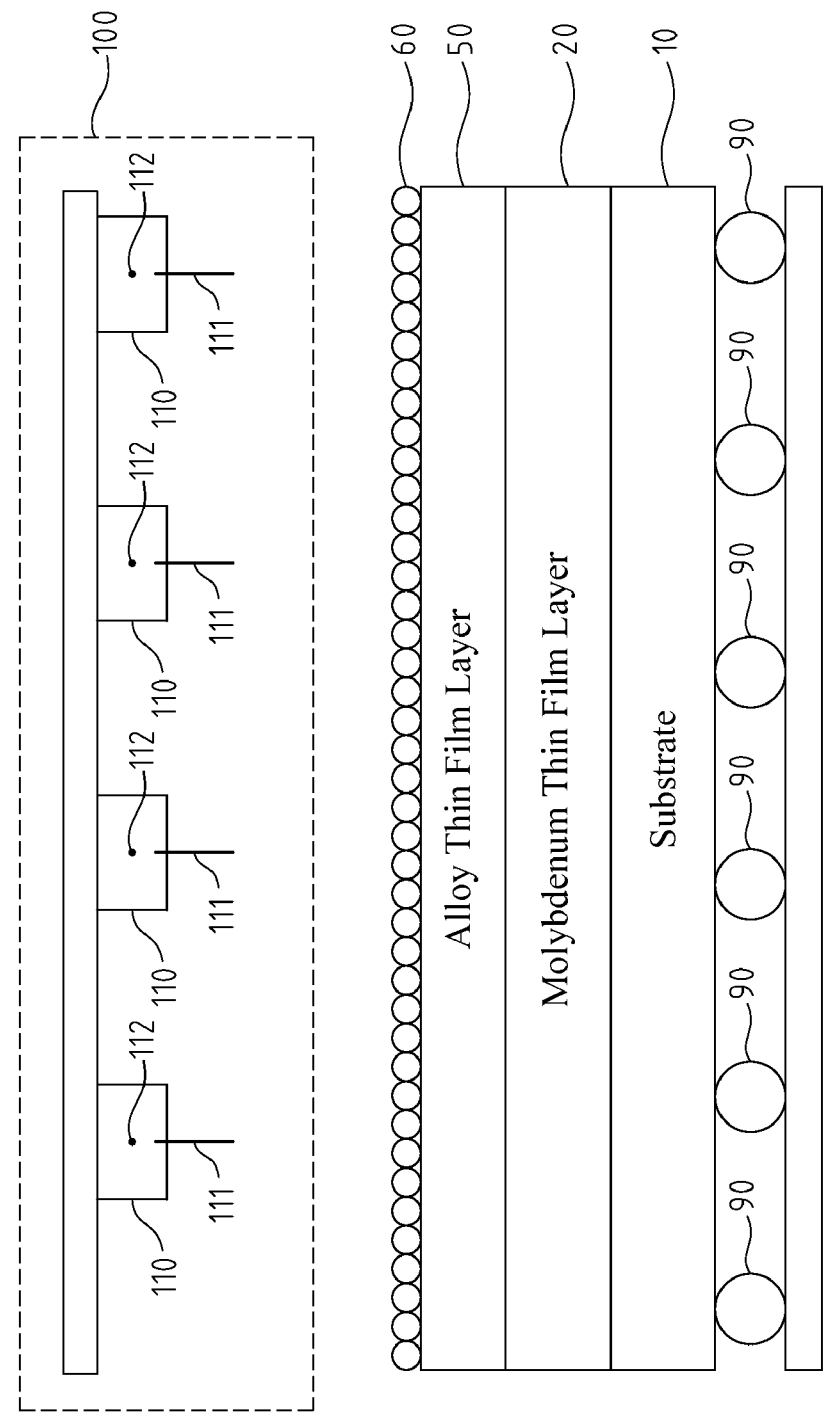
FIG. 3 is a schematic diagram illustrating the fabrication of the thermal expansion buffer layer of the present invention.

FIG. 3 is a schematic diagram illustrating the fabrication of the thermal expansion buffer layer of the present invention. Referring to FIG. 3, the substrate 10 together with the molybdenum thin film layer 20, the alloy thin film layer 50 configured thereupon are secured on a roller set 90, and driven to move along a direction indicated by the arrow shown in FIG. 3. A sputtering machine 100 is provided over the substrate 10 having the molybdenum thin film layer 20 and the alloy thin film layer 50 configured thereupon for configuring a thermal expansion buffer layer 60 on the alloy thin film layer 60. The sputtering machine 100 includes a plurality of target chambers 110. Each target chamber 110 includes a target 112, a sputtering gun (not shown in the drawings), and a sputtering ejector 111. The target 112 for example can be either cuprous sulphide ($Cu_2S$) or cuprous selenide ($Cu_2Se$). If the target 112 is cuprous sulphide ($Cu_2S$), then the thermal expansion buffer layer 60 will be a cuprous sulphide ($Cu_2S$) thermal expansion buffer layer, and if the target 112 is cuprous selenide ($Cu_2Se$), then the thermal expansion buffer layer 60 will be a cuprous selenide ($Cu_2Se$) thermal expansion buffer layer. The powers of the sputtering guns can be adjusted. By adjusting the powers of the sputtering guns, the amounts of the targets 112 ejected from the sputtering ejectors 111 can be adjusted. In such a way, a speed of configuring the thermal expansion buffer layer 60 can be controlled. Further, the thermal expansion buffer layer 60 is configured by sputtering with a plurality of sputtering ejectors 111 in a manner of continuous sputtering, and therefore the uniformity of the thickness of the thin films can be improved. The thermal expansion buffer layer 60 has a thickness ranging from 0.2 μm to 0.5 μm.

Then, a CIGS thin film layer 80 is configured on the thermal expansion buffer layer 60. Finally, a thermal treatment is conducted to the substrate 10, the molybdenum thin film layer 20, the alloy thin film layer 50, the thermal expansion buffer layer 60, and the CIGS thin film layer 80, thus configuring a CIGS solar cell having a low thermal expansion difference.

Figure 4:
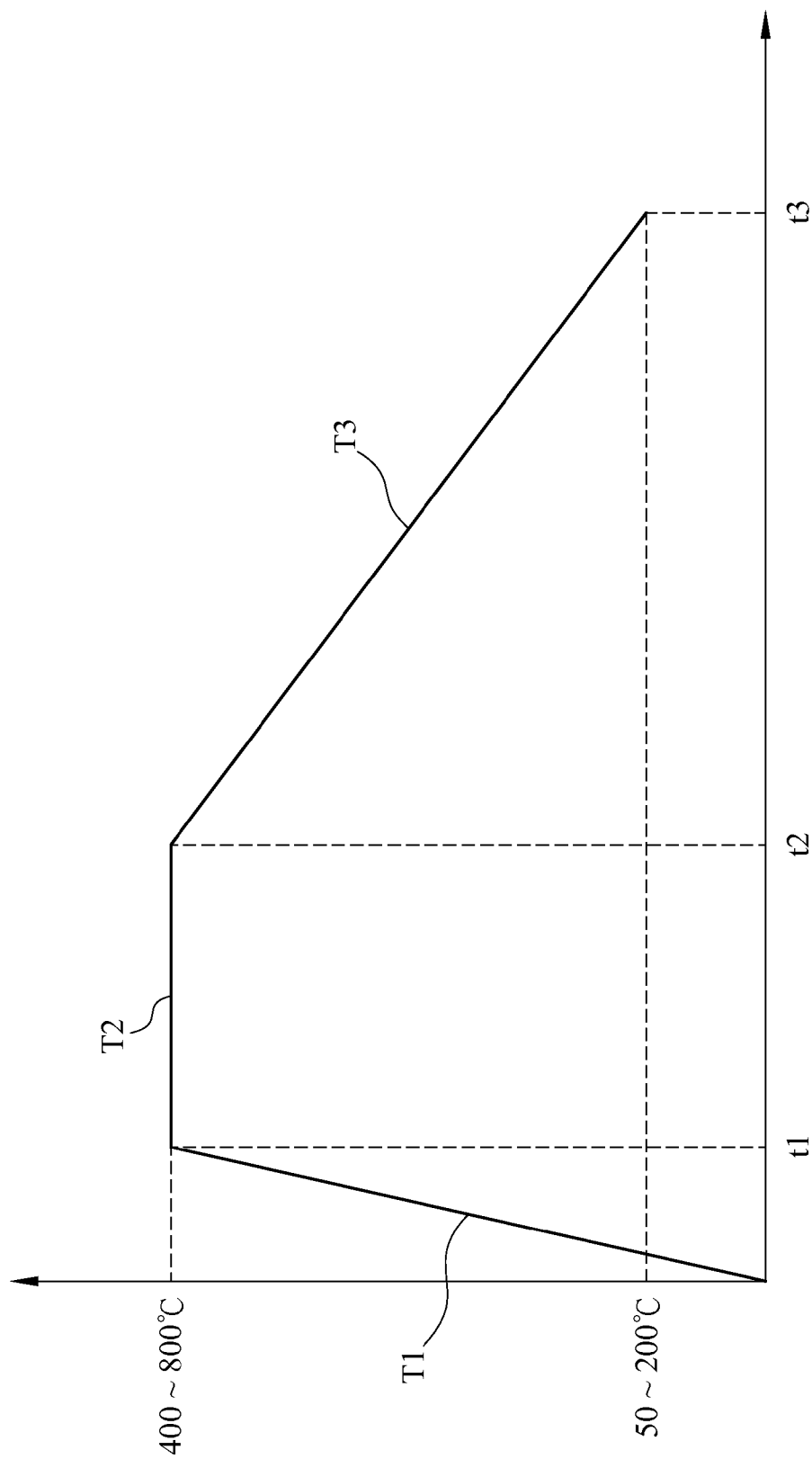
FIG. 4 is a schematic diagram illustrating the melting thermal treatment of the present invention.

FIG. 4 is a schematic diagram illustrating the melting thermal treatment of the present invention. Referring to FIG. 4, as shown in the temperature rising section T1 till the time t1, the thermal treatment is conducted to increase the temperature with a rate ranging from 5° C./sec to 10° C./sec up to a temperature ranging from 400° C. to 800° C. within 0.2 to 1 minute. Then, as shown in the temperature remaining section T2 till the time t2, the substrate 10 together with the molybdenum thin film layer 20, the alloy thin film layer 50, the thermal expansion buffer layer 60, and the CIGS thin film layer 80 configured thereon remain heated under the temperature for 10 to 20 minutes. Finally, as shown in the temperature decreasing section T3 till the time t3, argon or nitrogen is provided for rapid cooling down the substrate 10 together with the molybdenum thin film layer 20, the alloy thin film layer 50, the thermal expansion buffer layer 60, and the CIGS thin film layer 80 configured thereon to a temperature ranging from 50° C. to 100° C. within 15 to 200 minutes. In general, the thermal treatment takes 40 to 180 minutes. The thermal treatment of the present invention is adapted for melting to integrate the copper ingredients of the alloy thin film layer 50, the thermal expansion buffer layer 60, and the CIGS thin film layer 80, thus improving the bondability between the thin film layers. The thermal expansion buffer layer 60 is featured for having the thermal expansion coefficients of the thin film layers relatively approached one to another, thus preventing the cracking or the peeling off of the thin film layers caused by the thermal expansion difference.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for fabricating a copper/indium/gallium/selenium (CIGS) solar cell, comprising:
   putting a substrate having a molybdenum thin film layer and an alloy thin film layer configured thereupon on a roller set, wherein the molybdenum thin film layer and the alloy thin film layer are configured on the substrate by a sputtering process;
   driving the roller set to move the substrate toward a direction;
   using a sputtering machine provided over the alloy thin film layer to execute a sputtering operation on the alloy thin film layer to configure a thermal expansion buffer layer on the alloy thin film layer;
   configuring a CIGS thin film layer on the thermal expansion buffer layer by executing a thin film deposition process; and
   conducting a melting thermal treatment to the substrate, together with the molybdenum thin film layer, the alloy thin film layer, and the CIGS thin film layer.

2. The method for fabricating a CIGS solar cell according to claim 1, wherein the sputtering machine comprises a plurality of target chambers, each of the target chambers comprises a target, a sputtering gun, and a target sputtering ejector, wherein the sputtering operation comprises adjusting powers of the sputtering guns for adjusting an ejecting amount of the target, wherein the target is cuprous sulphide ($Cu_2S$) or cuprous selenide ($Cu_2Se$).

3. The method for fabricating a CIGS solar cell according to claim 1, wherein the thin film deposition process is a synchronizing evaporation deposition and selenylation process.

4. The method for fabricating a CIGS solar cell according to claim 1, wherein the thermal expansion buffer layer has a thermal expansion coefficient ranging from $5.0 \times 10^{-6}$ cm/° C. to $10.5 \times 10^{-6}$ cm/° C., and a thickness ranging from 0.2 μm to 0.5 μm.

5. The method for fabricating a CIGS solar cell according to claim 1, wherein the alloy thin film layer has a thermal expansion coefficient ranging from $5.0 \times 10^{-6}$ cm/° C. to $10.5 \times 10^{-6}$ cm/° C., and a thickness ranging from 0.1 μm to 0.25 μm.

6. The method for fabricating a CIGS solar cell according to claim 1, wherein the CIGS thin film layer has a thermal expansion ranging from $5.0 \times 10^{-6}$ cm/° C. to $9.3 \times 10^{-6}$ cm/° C., and a thickness ranging from 0.2 μm to 0.5 μm.

7. The method for fabricating a CIGS solar cell according to claim 1, wherein the thermal treatment comprises a temperature rising section, a temperature remaining section, and a temperature decreasing section.

8. The method for fabricating a CIGS solar cell according to claim 7, wherein in the temperature rising section, the thermal treatment is conducted to increase the temperature with a rate ranging from 5° C./sec to 10° C./sec up to a temperature ranging from 400° C. to 800° C. within 0.2 to 1 minute.

9. The method for fabricating a CIGS solar cell according to claim 7, wherein in the temperature remaining section, the temperature remains unchanged for 10 to 20 minutes.

10. The method for fabricating a CIGS solar cell according to claim 7, wherein in the temperature decreasing section, argon or nitrogen is provided for rapid cooling down the substrate together with the molybdenum thin film layer, the alloy thin film layer, the thermal expansion buffer layer, and the CIGS thin film layer configured thereon to a temperature ranging from 50° C. to 100° C. within 15 to 200 minutes.

* * * * *